United States Patent
Chung (10) Patent No.: US 8,301,959 B2
(45) Date of Patent: Oct. 30, 2012

(54) APPARATUS AND METHOD FOR PROCESSING BEAM INFORMATION USING LOW DENSITY PARITY CHECK CODE

(75) Inventor: Bi Woong Chung, Seoul (KR)

(73) Assignee: Maple Vision Technologies Inc., Ottawa (CA)

( * ) Notice: Subject to any disclaimer, the term of this patent is extended or adjusted under 35 U.S.C. 154(b) by 762 days.

(21) Appl. No.: 12/439,208

(22) PCT Filed: Aug. 13, 2007

(86) PCT No.: PCT/KR2007/003870
§ 371 (c)(1),
(2), (4) Date: Feb. 27, 2009

(87) PCT Pub. No.: WO2008/026836
PCT Pub. Date: Mar. 6, 2008

(65) Prior Publication Data
US 2010/0185912 A1      Jul. 22, 2010

(30) Foreign Application Priority Data
Sep. 1, 2006   (KR) .................. 10-2006-0084328

(51) Int. Cl.
*H03M 13/00*    (2006.01)
*G11C 29/00*    (2006.01)
(52) U.S. Cl. .................. 714/752; 714/763; 714/770
(58) Field of Classification Search .................. None
See application file for complete search history.

(56) References Cited

U.S. PATENT DOCUMENTS

| | | | | |
|---|---|---|---|---|
| 5,719,691 A | * | 2/1998 | Curtis et al. | 359/11 |
| 5,920,536 A | * | 7/1999 | Campbell et al. | 369/103 |
| 6,191,875 B1 | * | 2/2001 | Curtis et al. | 359/11 |
| 7,738,736 B2 | * | 6/2010 | Pharris | 382/298 |
| 2004/0057575 A1 | | 3/2004 | Zhang | |
| 2004/0240590 A1 | * | 12/2004 | Cameron et al. | 375/340 |

(Continued)

FOREIGN PATENT DOCUMENTS

JP    2004-310957    4/2004

(Continued)

OTHER PUBLICATIONS

Corresponding CN patent application No. 200780036715.0 Office Action with English Translation.

*Primary Examiner* — Guerrier Merant
(74) *Attorney, Agent, or Firm* — Venable LLP; Robert S. Babayi; Christopher Ma (57) ABSTRACT

An apparatus and method for processing optical information using a low density parity check code are suggested. An optical information recording method includes the steps of encoding data to record into a low density parity check code; representing the data, which is encoded into the low density parity check code, to a spatial light modulator in the unit of a data page; and modulating a recording beam into the data page representing the spatial light modulator to be recorded in the form of hologram in a recording medium. By blocking inexact probability information from being concentrated in the LDPC code block, by achieving exact probability information through effective allocation of a mark, and by improving average accuracy of the pixel, which corresponds to the LDPC code, failure rate of decoding can be minimized so that decoding performance can be improved.

38 Claims, 4 Drawing Sheets

U.S. PATENT DOCUMENTS

| | | | |
|---|---|---|---|
| 2005/0018263 A1* | 1/2005 | Pharris | 359/22 |
| 2005/0172209 A1* | 8/2005 | Cameron et al. | 714/794 |
| 2005/0240856 A1* | 10/2005 | Hayashi | 714/800 |
| 2005/0270855 A1* | 12/2005 | Earhart et al. | 365/189.05 |
| 2007/0180183 A1 | 8/2007 | Tsukagoshi | |
| 2007/0217626 A1* | 9/2007 | Sharma et al. | 381/100 |
| 2011/0206021 A9* | 8/2011 | Hansen et al. | 370/338 |

FOREIGN PATENT DOCUMENTS

| | | |
|---|---|---|
| JP | 2006-216148 A | 8/2006 |
| JP | 2005-302079 | 1/2012 |
| WO | 2005-083689 | 9/2005 |
| WO | WO 2005/083689 A1 | 9/2005 |

\* cited by examiner

APPARATUS AND METHOD FOR PROCESSING BEAM INFORMATION USING LOW DENSITY PARITY CHECK CODE

TECHNICAL FIELD

The present invention relates to an apparatus and method for processing optical information using a low density parity check code.

BACKGROUND ART

An optical information processing apparatus using the holography is a kind of page-oriented memories and uses a parallel signal processing as an input/output method. Accordingly, a holographic optical information processing apparatus can perform data processing faster than a CD (Compact Disk) or DVD (Digital Versatile Disk) which records or reproduces data by a bit.

An optical information processing apparatus using the holography performs recording operation by projecting an information beam, which contains an image information of data to record, and a reference beam, which is to be interfered with the information beam, to an optical information recording medium (ex, optical data storage). In the other hand, for reproducing, the reference beam is projected to the optical information recording medium, a reproduced beam, which is diffracted from the recording medium, is detected by an optical information detector such as a CMOS (Complementary Metal-Oxide Semiconductor) or CCD (Charge Coupled Device), and original data is reproduced by signal processing and decoding.

However, due to variations of channel characteristic such as contraction of the optical information recording medium, the detected data page may have errors when an image of data page is detected by the optical information detector. For example, a pixel of the data page (hereinafter, called as 'a data pixel') and a pixel of the optical information detector (hereinafter called as 'a detecting pixel') may not match with each other due to a mis??alignment. These errors may cause a fairly high bit error rate (BER).

To decrease BER, an error correction code (ECC) is introduced. Among ECCs, there is a low density parity check (LDPC) code whose performance close to the Shannon's theoretical limitation of the channel capacity. The LDPC code is a linear block code where most elements of the parity check matrix are symbol "0."

A parity check code has a block which contains information symbols and parity check symbols which is a modulo sum of specific information symbols so that it constitutes a code word.

The relation between the check symbols and the information symbols can be represented by a parity check matrix "H". The parity check matrix H can be represented by a set of linear homogeneous equations. That is, LDPC code is one of parity check codes and it has a parity check matrix of which most elements are symbol "0" and the remains have randomly scattered weights.

Encoding process of the LDPC code with the parity check matrix H is described as follows. When the parity check matrix H is achieved, a generator matrix G, which corresponds to the parity check matrix H, is generated by using the relation $GH^T=0$. A code word C, which corresponds to the information symbol block X, can be achieved from the relation $C=XG$. If numbers W and Wx (N/M) with respect to the matrix H ($H=N\times M$) are constant, where the number W is the number of is per each column and the number Wx (N/M) is the number of 1s per each raw, it is called as a regular LDPC code.

If the number of 1s per each column is not constant and the number of is per each raw is not exactly equal to Wax (N/M), it is called as an irregular LDPC code. It is generally known that an irregular LDPC code has better error correction capacity but it is harder to embody by hardware than a regular LDPC code.

Decoding of the LDPC code means the operation to detect the most probably approximate code word, which satisfies the relation where the product with the matrix H is equal to 0, from received signal vectors.

The sum-product algorithm among decoding methods of the LDPC code performs a soft decision iterative decoding using probability values. According to the sum-product algorithm, decoding is performed iteratively, while massages of probability are transmitted among nodes in the code word graph, until the code word, which satisfies the criteria of the maximum likelihood, is achieved.

There is another decoding method of LDPC code, so called LLR algorithm, which use a log-likelihood ratio (LLR). With respect to the LLR algorithm, Korean registered patent No. 10-0538281 can be referred.

The LLR algorithm is described in brief as follows. A LDPC decoder calculates initial LLR after calculating probabilities for each case when the data pixel is symbol "0" or "1".

DISCLOSURE OF INVENTION

Technical Solution

An optical information recording apparatus includes; an encoding portion for encoding data to record by using a low density parity check code; a light modulating portion for representing data, which is encoded at the encoding portion, into a data page which is configured with a plurality of data blocks; and a beam source for projecting beam to the light modulating portion so that the data page represented in the light modulating portion is recorded at a recording medium as hologram.

The data page may include the data block and an address block.

The data block may be configured with a plurality of sub-blocks and a mark which is located at the center of the data block.

The mark may be used as information to calculate reproduction probability of the data block.

The encoding portion may include an encoder for encoding the data into the low density parity check code and a mapping unit for mapping the low density parity check code in the unit of the data page.

The mapping unit may map the low density parity check codes, which is encoded at the encoding unit, into the data page after scrambling.

The data page may include the data block and address block for addressing the data page, the data block is configured with a plurality of subblocks and mark which is located at the center of the data block.

The low density parity check code, which is encoded at the encoder, may be divided into a plurality of areas as many as the number of the data blocks and each area may be divided into a plurality of segments as many as the number of the areas.

The number of the data block N (N is a positive integer), the number of areas and the number of the subblocks may be equal to each other.

The mapping unit may map the j-th segment (j=1, 2, 3 ... N) of the i-th area (i=1, 2, 3 ... N) into the (((i+j−2)mod N)+1)-th subblock of the j-th (j=1, 2, 3 ... N) data block.

An optical information recording method includes encoding data into a low density parity check code; representing the data, which is encoded into the low density parity check code, to a spatial light modulator in the unit of a data page; and modulating a recording beam into the data page representing the spatial light modulator to be recorded in the form of hologram in a recording medium.

The data page may include a data block in which data, which is encoded into the low density parity check code, is mapped and an address block, which has address information of the data page.

The data block may be configured with a plurality of subblocks and a mark which is located at the center of the data block.

The mark may be used as information to calculate reproduction probability of the data block which includes the subblocks.

The low density parity check code may be mapped into the data block after scrambling.

The data page may include the data block and an address block for addressing the data page, the data block may be configured with a plurality of subblocks and a mark which is located at the center of the data block.

The low density parity check code may be divided into a plurality of areas as many as the number of the subblocks and each area may be divided into a plurality of segments as many as the number of the areas.

The number of the data block N (N is a positive integer), the number of areas and the number of the subblocks may be equal to each other.

The j-th segment (j=1, 2, 3 ... N), which is one of segments included in the i-th area (i=1, 2, 3 ... N), may be mapped into the (((i+j−2)mod N)+1)-th subblock of the j-th (j=1, 2, 3 ... N) data block.

An optical information reproducing apparatus includes a beam source; an optical information detecting portion for detecting the data page, which is reproduced from a recording medium by the beam which is projected from the beam source; and a decoding portion for identifying an addressing block, detecting subblocks which is included in a data block and a mark which is located at the center of the data block from the plurality of data blocks which is included in the data page and decoding data of the subblock.

The decoding portion may include a demapping unit for demapping the subblock of the data page, which is detected at the optical information detecting portion, and a decoder for decoding the subblock into a low density parity check code by using the value that is demapped at the demapping unit.

The decoder may perform decoding process by using probability value which is calculated from the density of the data block at the demapping unit.

The density of the data block may be calculated by using the density of the mark.

An optical information reproducing method includes detecting a data page which is reproduced from a recording medium by projection beam from a light source to the recording medium; identifying an address block which is included in the data page; detecting a plurality of data blocks which are included in the data page, a mark which is located at the center of the data block and a plurality of subblocks which are located around the mark; and decoding data which is detected from the subblocks into a low density parity check code. Decoding can be performed by using probability value which is calculated from the density of the data blocks. To calculate the probability value, the density of the mark can be used.

The data page which is represented for processing of holographic data may include a plurality of data blocks, a mark which is denoted at the center of the data block and used for reproducing, and a plurality of subblocks which are denoted around the mark.

The data, which is represented at the subblock, may be a low density parity check code. The data page may include address block which is represented around the data block. The mark may be used as information to calculate reproducing probability of the data block which includes the subblocks.

In the data block, the low density parity check code can be scrambled in the subblocks. The low density parity check code of the subblock may be divided into a plurality of areas as many as the number of the subblocks except the mark and each area may be divided into a plurality of segments as many as the number of the areas.

The number of the data blocks N (N is a positive integer), the number of the areas and the number of the subblocks except the mark may be equal to each other.

The j-th segment (j=1, 2, 3 ... N), which is one of segments included in the i-th area (i=1, 2, 3 ... N), may be the segment that is mapped into the (((i+j−2)mod N)+1)-th subblock of the j-th (j=1, 2, 3 ... N) data block.

The data page for processing of holographic data according to the present invention includes a plurality of data blocks; a mark which is denoted at the center of the data block and used for reproducing; and a plurality of subblocks which are denoted around the mark.

The data page may be represented to a spatial light modulator or can be detected from an optical information detector. The data which is mapped to the subblock may be a low density parity check code. The data page may include an address block which is represented around the data block.

The mark may be used as information to calculate reproducing probability value of the data block which includes the subblocks.

Data in the form of the low density parity check code may be mapped to the subblocks after being scrambled or may be the mapped one.

The low density parity check code is divided into a plurality of areas as many as the number of the subblocks except the mark and each area may be divided into a plurality of segments as many as the number of the areas.

The number of the data block N (N is a positive integer), the number of areas and the number of the subblocks may be equal to each other.

The j-th segment (j=1, 2, 3 ... N), which is one of segments included in the i-th area (i=1, 2, 3 ... N), may be mapped into the (((i+j−2)mod N)+1)-th subblock of the j-th (j=1, 2, 3 ... N) data block, or may be the segment that is mapped into the (((i+j−2) mod N)+1)-th subblock of the j-th (j=1, 2, 3 ... N) data block.

A method for mapping a data page to a light modulator for recording holographic data includes representing a data block by a mark, which is used for reproducing, and a plurality of subblocks, which is arranged around the mark; and representing the data page by the data block and the address block.

The data, which is mapped to the subblock, may be encoded to a low density parity check code. The mark may be used as information to calculate reproducing probability of the data block.

Data, which is encoded to a low density parity code, may be mapped to the data block after being scrambled with the subblocks.

The low density parity check code, which is mapped to the subblock, is divided into a plurality of areas as many as the number of the subblocks except the mark and each area may be divided into a plurality of segments as many as the number of the areas.

The number of the data blocks N (N is a positive integer), the number of the areas and the number of the subblocks except the mark may be equal to each other.

The j-th segment (j=1, 2, 3 ... N), which is one of segments included in the i-th area (i=1, 2, 3 ... N), may be mapped into the (((i+j−2)mod N)+1)-th subblock of the j-th (j=1, 2, 3 ... N) data block.

A decoding method of holographic data includes demapping a data page, which includes an address block, a data block and a subblock including a mark, from an optical information detector which detects a reproducing beam; and decoding the reproduced data from the data page into a low density parity check code by using the mark.

The mark may be used to calculate probability value for reproducing.

Decoding into the low density parity check code may be performed by using the density of the data block.

Advantageous Effects

The optical information processing apparatus and method using a low density parity check code according to an embodiment of the present invention can be used to record data or reproduce data in the holographic optical information processing apparatus.

By blocking inexact probability information from being concentrated in the LDPC code block, by achieving exact probability information through effective allocation of a mark, and by improving average accuracy of the pixel, which corresponds to the LDPC code, failure rate of decoding can be minimized so that decoding performance can be improved.

BRIEF DESCRIPTION OF THE DRAWINGS

The embodiments will be described in detail with reference to the following drawings, in which like numerals refer to like element and wherein.

MODE FOR THE INVENTION

Figure 1:
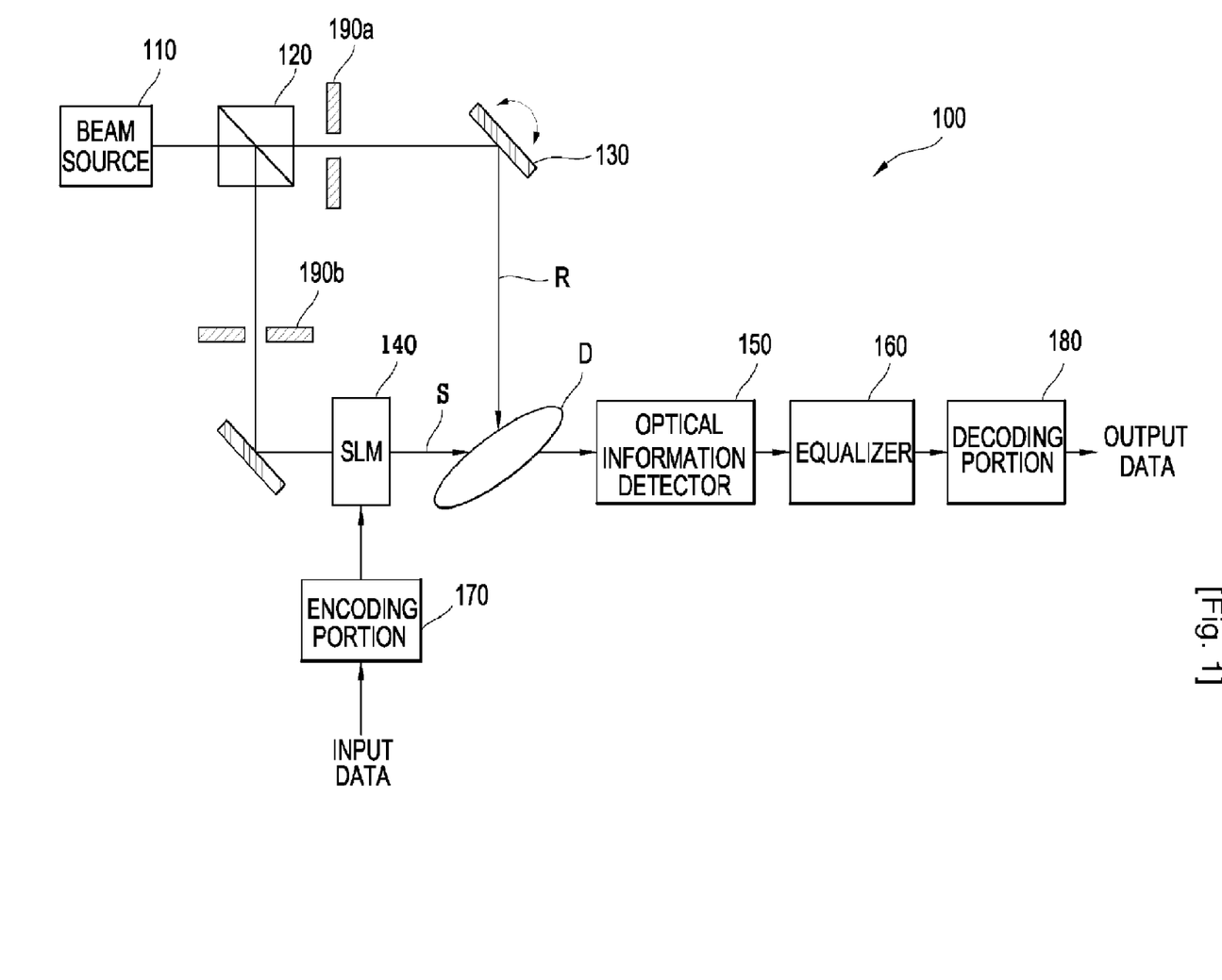
FIG. 1 is a block diagram illustrating an optical information recording/reproducing apparatus according to the embodiment of the present invention.

FIG. 1 shows a block illustrating an optical information recording/reproducing apparatus.

The optical information recording/reproducing apparatus 100 includes a beam source 110, a beam splitter 120, an angle multiplexer 130, a spatial light modulator 140, an optical information detector 150, an equalizer 160, an encoding portion 170 and a decoding portion 180, as shown in FIG. 1.

Light projected from the beam source 110 is split into a reference beam R and an information beam S through the beam splitter 120. The reference beam R goes through the first shutter 190a and is projected to optical data storage at the specific angle after it is reflected at the angle multiplexer 130.

In addition, the information beam S, where data is not loaded, goes through the second shutter 190b and is projected to the spatial light modulator 140 after its path is changed by a reflecting mirror.

Meanwhile, the spatial light modulator 140 represents binary data, which is received from the encoding portion 170, in the unit of data page. The encoding portion 170 encodes original data to record into a LDPC code and supplies it with the spatial light modulator 140 in the unit of the data page.

The spatial light modulator 140 generates 2-dimensional image data of the data page by optically modulating the data page, which is supplied from the encoding portion 170, and projects the data page to the incident information beam S. Accordingly, the information beam S becomes a real information beam, where data to be recorded is loaded, by passing through the spatial light modulator 140. After this, a signal beam, which passes through the spatial light modulator 140, is projected to the optical data storage.

If the reference beam R and the information beam S are projected to the optical data storage D, an interference pattern is recorded because a light induction of an internal mobile charge is generated depending on the intensity of the interference pattern which is generated by the interference between the reference beam R and the information beam S in the optical data storage D.

When recording the optical information, the angle multiplexer 130 controls the angle of the reference beam R, which is projected to the optical data storage D so that angle multiplexing of the reference beam R can be realized. The angle multiplexer 130 can be embodied by a rotating mirror like a galvano mirror.

For reproducing recorded data to the optical data storage D, only the reference beam R is projected to the optical data storage D. For this, the first shutter 190a passes only the reference beam R which is split by the beam splitter 120. Meanwhile the second shutter 190b blocks the information beam S which is split by the beam splitter 120.

At this time, the reference beam R goes through the first shutter 190a and is projected to the interference pattern, which is recorded to the optical data storage D after being reflected by the angle multiplexer 130. When the reference beam R is projected to the interference pattern, a reproducing beam, which has the image of the data page, is generated from the interference pattern, which is recorded to the optical data storage D by diffraction.

The reproducing beam is detected by the optical information detector 150 in the unit of the data page. Detected data page is equalized by the equalizer 160 and decoded by the decoding portion 180.

The optical information detector 150 may be embodied by a photo detector array for example, CMOS (Complementary Metal Oxide Semiconductor) or CCD (Charge Coupled Device). For embodying the equalizer 160, a MMSE (Minimum Mean Square Error) equalizer can be used.

The decoding portion 180 decodes a LDPC code. The decoding portion 180 decodes a LDPC code from the equalizer 160 and outputs reproduced data.

Example of the data page will be described as follows.

Figure 2:
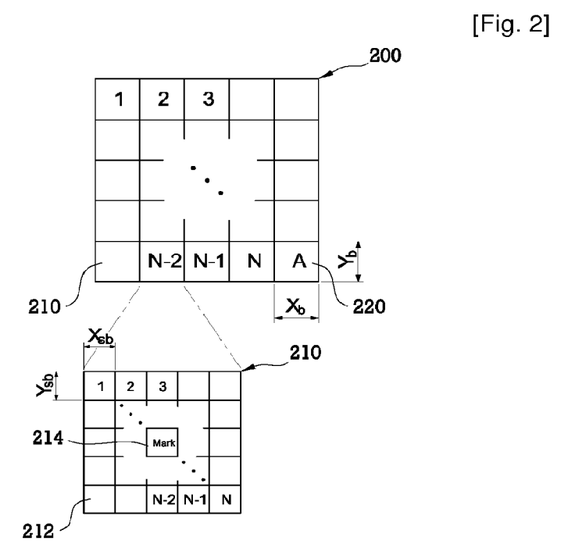
FIG. 2 shows format of a data page according to the embodiment of the present invention.
Figure 3:
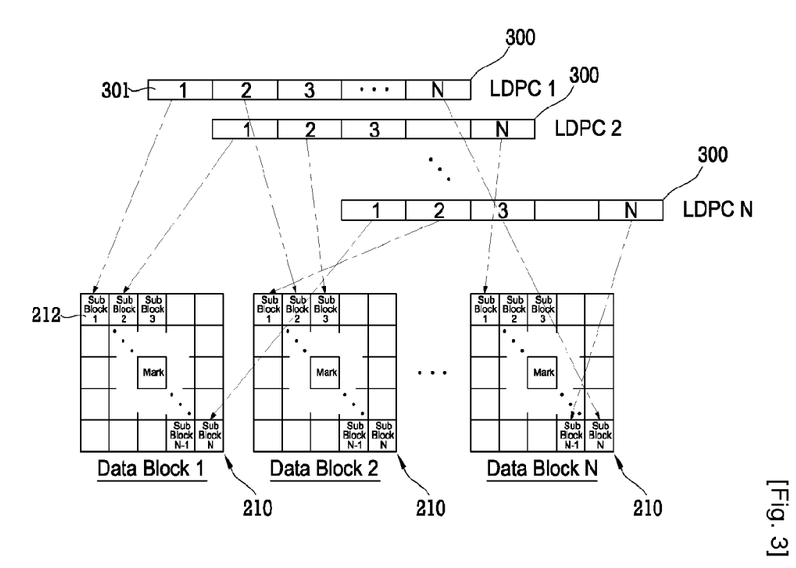
FIG. 3 shows a mapping method of the data page according to the embodiment of the present invention.

FIG. 2 shows the format of the data page and FIG. 3 shows a mapping method of the data page.

The data page 200 includes data blocks 210 of N (N is a positive integer) where a LDPC code 300 (refer to FIG. 3) is mapped, address blocks 220 of m (m is a positive integer) where addressing information for addressing the data page 200 for reproducing is mapped.

The data block 210 and the address block 220 have the same size "Xb×Yb". Here, "Xb" stands for the number of pixels in the row direction and "Yb" stands for the number of pixels in the column direction. And the address block 220 can be located to any location in the data page 200.

The data block includes a plurality of subblocks. The number of the subblocks may be equal to the sum of the data blocks and the subblocks which constitute the data page.

The subblock 212 has the size of "Xsb×Ysb." Here, "Xsb" stands for the number of pixels in the row direction and "Ysb" stands for the number of pixels in the column direction. And the number of subblocks 212 is (N+m), which is equal to the sum of the number of the data blocks 210 and the number of address blocks 220 which constitute the data page 200, A LDPC code is divided into the size of "Xsb×Ysb" and mapped into N subblocks among whole of the subblocks 212 individually while the mark 214 is mapped into m subblocks.

The mark 214 is used to abstract information to calculate probability of the subblock 212 which corresponds to the data block 210 where the mark 214 is belonged to. The mark 214 is located at the center of the data block 210 and entire area of mark 214 is denoted by on-pixels or off-pixels only.

LDPC codes, which is encoded at the encoding portion 170 in the unit of data page, are divided into a plurality of LDPC code areas (LDPC1, LDPC2, . . . , LDPC N) 300, which is sized as the same as the size of the data block 210 "Xb×Yb". And divided LDPC code areas 300 are divided into a plurality of segments 310 as being sized as the size of the subblock 212 "Xsb×Ysb". Accordingly, LDPC code, which is included in a segment 310, can be mapped to a subblock 212. (Refer to FIG. 3)

If each LDPC code area 300 is divided into the size of the subblock 212 "Xsb×Ysb," a dividend should be a positive integer. That is, the length of the LDPC code should be designed to satisfy the relation "n(Xsb×Ysb)=(Xb×Yb)−m(Xsb×Ysb)".

Refer to FIG. 3, assuming that a serial number, which is assigned to each of the LDPC code areas 300 (LDPC1, LDPC2, . . . , LDPCN 300), is i (i=1, 2, 3 . . . N) and other serial number, which is assigned to each segment 301 included in each LDPC code area 300 is j (j=1, 2, 3 . . . N), another serial number, which is assigned to each data block can be defined by j (j=1, 2, 3 . . . N) as well as the serial number, which is assigned to each segment 301.

If the data of the j-th segment 301 of the i-th LDPC code area 300 is mapped into the (((i+j−2)mod N+1)-th subblock 212 of j-th data block 210, segments 310 of a LDPC code area 300, which is divided into the size of "Xsb×Ysb", are mapped into the separate subblock 212 of the separate data block 210 individually.

That is, segments 301, which are included in a LDPC code area 300, are scrambled and mapped to separate subblock 212 of separate data block 210.

When segments 310 of a LDPC code area 300 are scrambled and mapped to separate subblock 212 of separate data block 210, inexact information detected from the subblock 212 which is located far from the mark 214, can be complemented.

Encoding process and decoding process of the data page which are performed when optical information is recorded and reproduced individually will be described in detail.

Each element to be referred hereinafter and explanation can be understood by referring to FIG. 1 through FIG. 3.

Figure 4:
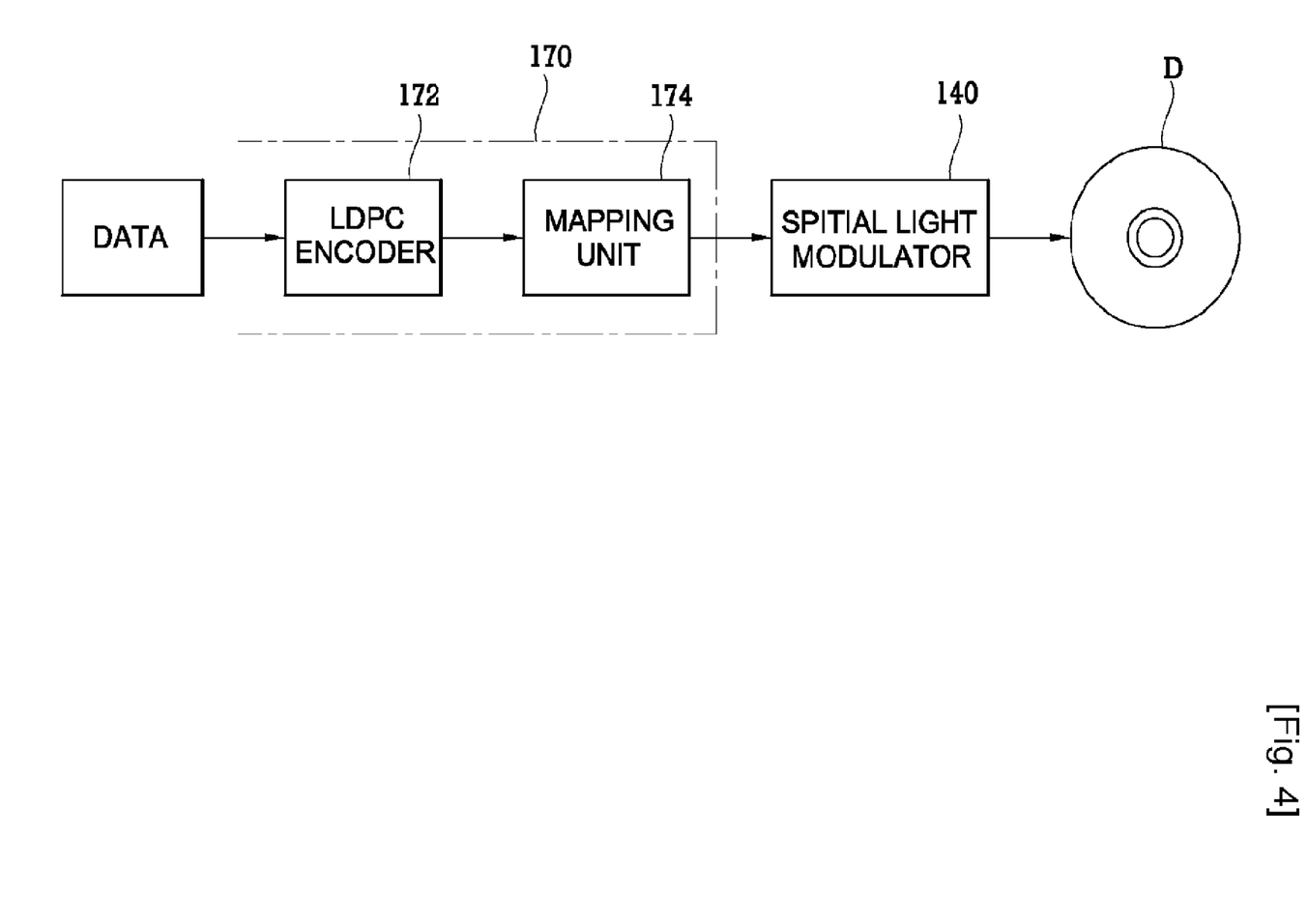
FIG. 4 is a block diagram illustrating encoding process of data for recording according to the embodiment of the present invention.
Figure 5:
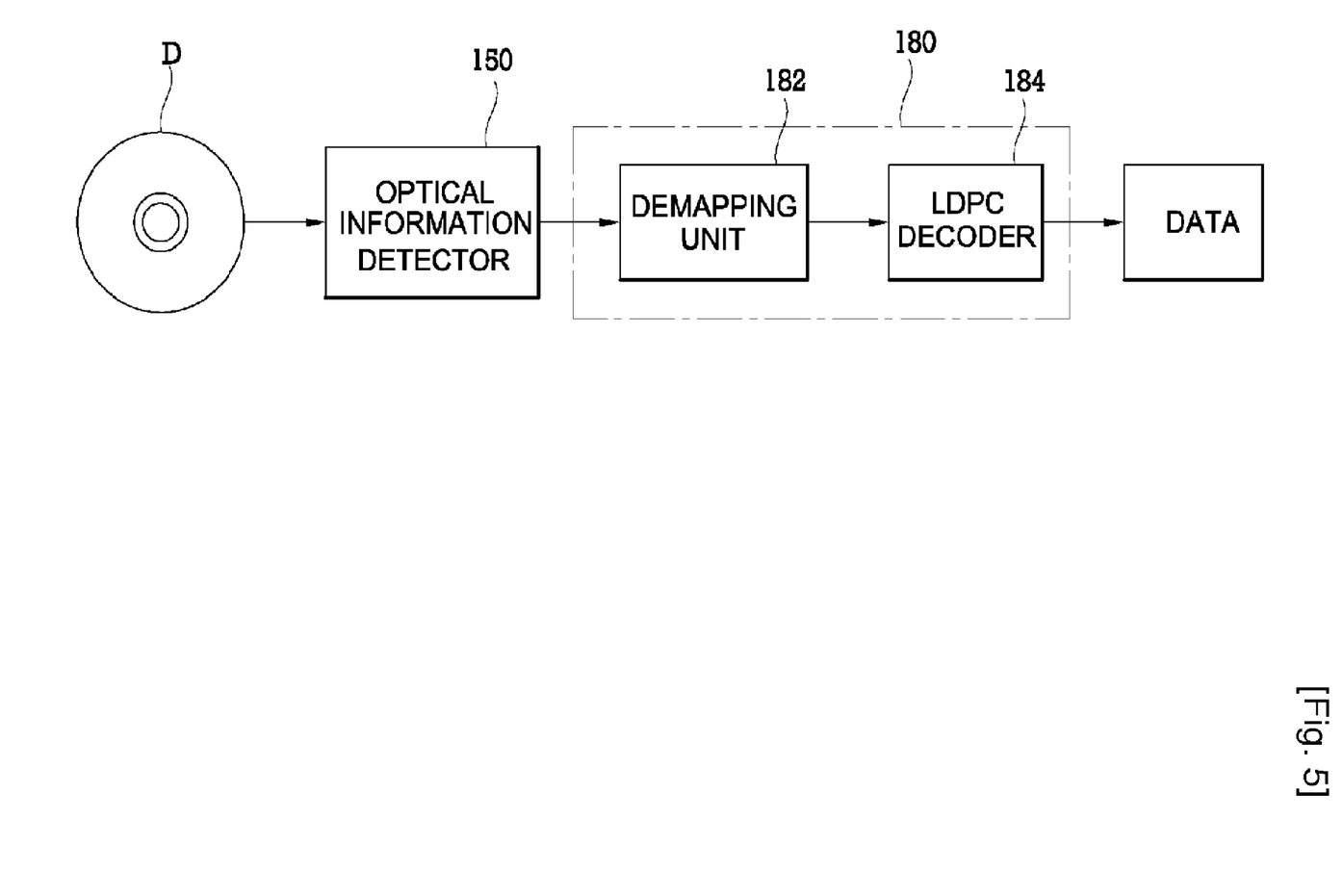
FIG. 5 is a block diagram illustrating decoding process of data for reproducing according to the embodiment of the present invention.

FIG. 4 is a block diagram illustrating encoding process of data for recording and FIG. 5 is a block diagram illustrating decoding process of data for reproducing.

Encoding process is performed by the encoding portion 170. The encoding portion 170 includes a LDPC encoder 172 for generating a LDPC code 300 by using input data and a mapping unit 174 for mapping the LDPC code 300, which is generated by the LDPC encoder 172, into the data block 210 and the subblock 212 of the data page 200 and mapping the address block 220 and the mark 214 of the subblock 212, as shown in FIG. 4.

If data to be recorded is input, the LDPC encoder 172 encodes data into a LDPC code 300. Generated LDPC code 300 is mapped to each subblock 212 of the data block 210 by the mapping unit 174. The LDPC code 300 to be mapped to the subblock 212 will be understood through the above-mentioned description. And all the pixels of the address block 220 or the mark 214 can be mapped into on-pixel or off-pixel only.

Data page 200, whose mapping operation is completed, is loaded on the information beam S at the spatial light modulator 140. When the information beam S is projected to the optical data storage D, recording information of the corresponding data page 200 is recorded as an interference pattern to the optical data storage D by the interference between the information beam S and the reference beam R.

After that, decoding of data is performed by the decoding portion 180, as shown in FIG. 5.

The decoding portion 180 includes a demapping unit 182 for demapping an address blocks 220, data blocks 210 and subblocks 212 for reproducing the data page 200, which is detected from the optical information detector 150, and for calculating probability value for decoding by using the subblock 212 and the mark and a LDPC decoder 184 for performing LDPC decoding by using the probability value, which is achieved at the demapping unit 182, and the density of the data block 210, which is achieved from the demapped data page 200.

When reproducing the recorded optical information to the optical data storage D, the decoding portion 180 can achieve decoding probability value and the density for LDPC decoding by using the address block 220 and the mark 214 of subblock 212 so that the decoding portion 180 can decode optical information which is reproduced from the optical data storage D.

The invention claimed is:

1. An optical information recording apparatus, which comprises:
    an encoding portion for encoding data by using a low density parity check code;
    a light modulating portion for representing data, which is encoded at the encoding portion, into a data page which is configured with a plurality of data blocks; and
    a beam source for projecting beam to the light modulating portion so that the data page represented in the light modulating portion is recorded at a recording medium as hologram,
    wherein the data block is configured with a plurality of subblocks and mark which is located at the center of the data block,
    wherein the mark includes information to calculate reproduction probability of the data block which includes the subblocks.

2. The optical information recording apparatus in claim 1, wherein the data page includes the data block and an address block.

3. The optical information recording apparatus in claim 1, wherein the encoding portion comprising:
an encoder for encoding the data into the low density parity check code; and
a mapping unit for mapping the low density parity check code in the unit of the data page.

4. The optical information recording apparatus in claim 3, wherein the mapping unit maps the low density parity check codes, which is encoded at the encoding unit, into the data page after scrambling.

5. The optical information recording apparatus in claim 3, wherein the low density parity check code, which is encoded at the encoder, is divided into a plurality of areas as many as the number of the datablocks and each area is divided into a plurality of segments as many as the number of the areas.

6. The optical information recording apparatus in claim 5, wherein the number of the data block N (N is a positive integer), the number of areas and the number of the subblocks except the mark are equal to each other.

7. The optical information recording apparatus in claim 6, wherein the mapping unit maps the j-th segment (j=1, 2, 3 ... N) of the i-th area (i=1, 2, 3 ... N) into the (((i+j−2)mod N)+1)-th subblock of the j-th (j=1, 2, 3 ... N)data block.

8. An optical information recording method, which comprises the steps of:
encoding data into a low density parity check code;
representing the data, which is encoded into the low density parity check code, to a spatial light modulator in the unit of a data page; and
modulating a recording beam into the data page representing the spatial light modulator to be recorded in form of hologram in a recording medium,
wherein the data page includes a data block in which data, which is encoded into the low density parity check code, is mapped,
wherein the data block is configured with a plurality of subblocks and a mark which is located at the center of the data block,
wherein the mark is used as information to calculate reproduction probability of the data block which includes the subblocks.

9. The optical information recording method in claim 8, wherein the data page includes an address block, which has address information of the data page.

10. The optical information recording method in claim 9, wherein the low density parity check code is mapped into the data block after being scrambled.

11. The optical information recording method in claim 9, wherein the low density parity check code is divided into a plurality of areas as many as the number of the data blocks and each area is divided into a plurality of segments as many as the number of the areas.

12. The optical information recording method in claim 11, wherein the number of the data block N (N is a positive integer), the number of areas and the number of the subblocks except the mark are equal to each other.

13. The optical information recording method in claim 12, wherein the j-th segment (j=1, 2, 3 ... N), which is one of segments included in the i-th area (i=1, 2, 3 ... N), is mapped into the (((i+j−2)mod N)+1)-th subblock of the j-th (j=1, 2, 3 ... N) data block.

14. An optical information reproducing apparatus, which comprises:
a beam source;
an optical information detecting portion for detecting the data page, which is reproduced from the recording medium by projecting the beam which is projected from the beam source to a recording medium; and
a decoding portion for identifying an addressing block, detecting subblocks which are included in a data block and a mark which is located at the center of the data block from the plurality of data blocks which is included in the data page and decoding data of the subblock,
wherein the mark includes information to calculate reproduction probability of the data block which includes the subblocks.

15. The optical information reproducing apparatus in claim 14, wherein the decoding portion includes a demapping unit for demapping the subblock of the data page, which is detected at the optical information detecting portion, and a decoder for decoding the subblock into a low density parity check code by using the value that is demapped at the demapping unit.

16. The optical information reproducing apparatus in claim 15, wherein the decoder performs decoding process by using probability value which is calculated from the density of the data block at the demapping unit.

17. The optical information reproducing apparatus in claim 16, wherein the density of the data block is calculated by using the density of the mark.

18. An optical information reproducing method, which comprises the steps of:
detecting a data page which is reproduced from a recording medium by projecting beam which is projected from a light source to the recording medium;
identifying an address block which is included in the data page;
detecting a plurality of data blocks which are included in the data page, a mark which is located at the center of the data block and a plurality of subblocks which are located around the mark; and
decoding data which is detected from the subblocks into a low density parity check code,
wherein the mark includes information to calculate reproduction probability of the data block which includes the subblocks.

19. The optical information reproducing method in claim 18, wherein the decoding is performed by using probability value which is calculated from the density of the data blocks.

20. The optical information reproducing method in claim 19, wherein the density of the data block is calculated by using the density of the mark.

21. A device for processing of holographic data, which comprises: a decoding portion configured to process a data page, the data page including
a plurality of data blocks; a mark which is denoted at the center of the data block and used for reproducing; and a plurality of subblocks which are denoted around the mark, wherein the mark includes information to enable the decoding portion to calculate reproduction probability of the data block which includes the subblocks.

22. The A device in claim 21, wherein the data page is represented to a spatial light modulator or detected from an optical information detector.

23. The data page in claim 21, wherein the data which is mapped to the subblock is a low density parity check code.

24. A device in claim 21, wherein the data page includes an address block.

25. A device in claim 21, wherein data in the form of the low density parity check code is mapped after being scrambled with the subblocks in the data block.

26. A data page device in claim 25, wherein the low density parity check code is divided into a plurality of areas as many as the number of the subblocks and each area is divided into a plurality of segments as many as the number of the areas.

27. A data page device in claim 26, wherein the number of the data block N (N is a positive integer), the number of areas and the number of the subblocks except the mark is equal to each other.

28. A data page device in claim 27, wherein the j-th segment (j=1, 2, 3 ... N), which is one of segments included in the i-th area (i=1, 2, 3 ... N), is mapped into the (((i+j−2)mod N)+1)-th subblock of the j-th (j=1, 2, 3 ... N) data block, or is the segment that is mapped into the (((i+j−2)mod N)+1)-th subblock of the j-th (j=1, 2, 3 ... N) data block.

29. A mapping method for mapping a data page to a light modulator for recording holographic data, which comprises the steps of:
representing a data block by a mark, which is used for reproducing, and a plurality of subblocks, which is arranged around the mark; and
representing the data page by the data block and the address block,
wherein the mark includes information to calculate reproduction probability of the data block which includes the subblocks.

30. The mapping method in claim 29, wherein the data, which is mapped to the subblock, is encoded to a low density parity check code.

31. The mapping method in claim 29, wherein data, which is encoded to a low density parity code, is mapped to the data block after being scrambled with the subblocks.

32. The mapping method in claim 31, wherein the low density parity check code, which is mapped to the subblock, is divided into a plurality of areas as many as the number of the subblocks and each area is divided into a plurality of segments as many as the number of the areas.

33. The mapping method in claim 32, wherein the number of the data blocks N (N is a positive integer), the number of the areas and the number of the subblocks except the mark are equal to each other.

34. The mapping method in claim 33, wherein the j-th segment (j=1, 2, 3 ... N), which is one of segments included in the i-th area (i=1, 2, 3 ... N), is mapped into the (((i+j−2) mod N)+1)-th subblock of the j-th (j=1, 2, 3 ... N) data block.

35. A decoding method of holographic data, which comprises the steps of
demapping a data page, which includes an address block, a data block and a subblock including a mark, from an optical information detector array which detects a reproducing beam; and
decoding the reproduced data from the data page into a low density parity check code,
wherein the mark includes information to calculate reproduction probability of the data block which includes the subblock.

36. The decoding method in claim 35, wherein the decoding into the low density parity check code is performed by using the density of the data block.

37. An optical information reproducing method comprising:
detecting a plurality of subblocks and a mark in a data block reproduced from a recording medium;
determining exact probability information based on the mark;
determining inexact probability information based on the plurality of subblocks; and
decoding data stored in the data block using the inexact probability information and the exact probability information.

38. An optical information recording method comprising:
encoding data into a low density parity check code;
dividing the low density parity check code into a plurality of areas;
dividing each area of the plurality of areas into a plurality of segments;
mapping the segments of the plurality of segments into subblocks of blocks in a data page, where the segments of an area of the plurality of areas are mapped into different blocks; and
recording the mapped segments onto a recording medium.

* * * * *

UNITED STATES PATENT AND TRADEMARK OFFICE
CERTIFICATE OF CORRECTION

| | | |
|---|---|---|
| PATENT NO. | : 8,301,959 B2 | Page 1 of 1 |
| APPLICATION NO. | : 12/439208 | |
| DATED | : October 30, 2012 | |
| INVENTOR(S) | : Bi Woong Chung | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 781 days.

Signed and Sealed this
Twenty-third Day of April, 2013

Teresa Stanek Rea
*Acting Director of the United States Patent and Trademark Office*